United States Patent [19]

Kuisma

[11] Patent Number: 5,124,672
[45] Date of Patent: Jun. 23, 1992

[54] COMBINED ANALOG/DIGITAL FREQUENCY MODULATOR

[75] Inventor: Erkki J. Kuisma, Salo, Finland

[73] Assignee: Nokia-Mobira Oy, Salo, Finland

[21] Appl. No.: 382,557

[22] Filed: Jul. 19, 1989

[30] Foreign Application Priority Data

Aug. 16, 1988 [FI] Finland .................................. 883790

[51] Int. Cl.$^5$ .............................................. H03C 1/00
[52] U.S. Cl. ...................................... 332/103; 332/119
[58] Field of Search ............... 332/117, 119, 185, 103, 332/104, 105, 120

[56] References Cited

U.S. PATENT DOCUMENTS 4,682,123  7/1987  Loper et al. .................... 332/119 X Primary Examiner—Robert J. Pascal
Attorney, Agent, or Firm—Darby & Darby

[57] ABSTRACT

A circuit arrangement allows either analog (ANAL) modulation or (DIG) digital modulation to be selected by means of couplers (K1, K2) for transmission over a radio channel. The analog or digital signals are applied to I,Q generators to form I, Q wave shapes ($I_A$, $Q_A$ or $I_D$, $Q_D$), which modulate a possible intermediate frequency in a stage (3) and upon summation, modulate a transmission frequency in a stage (4).

4 Claims, 1 Drawing Sheet

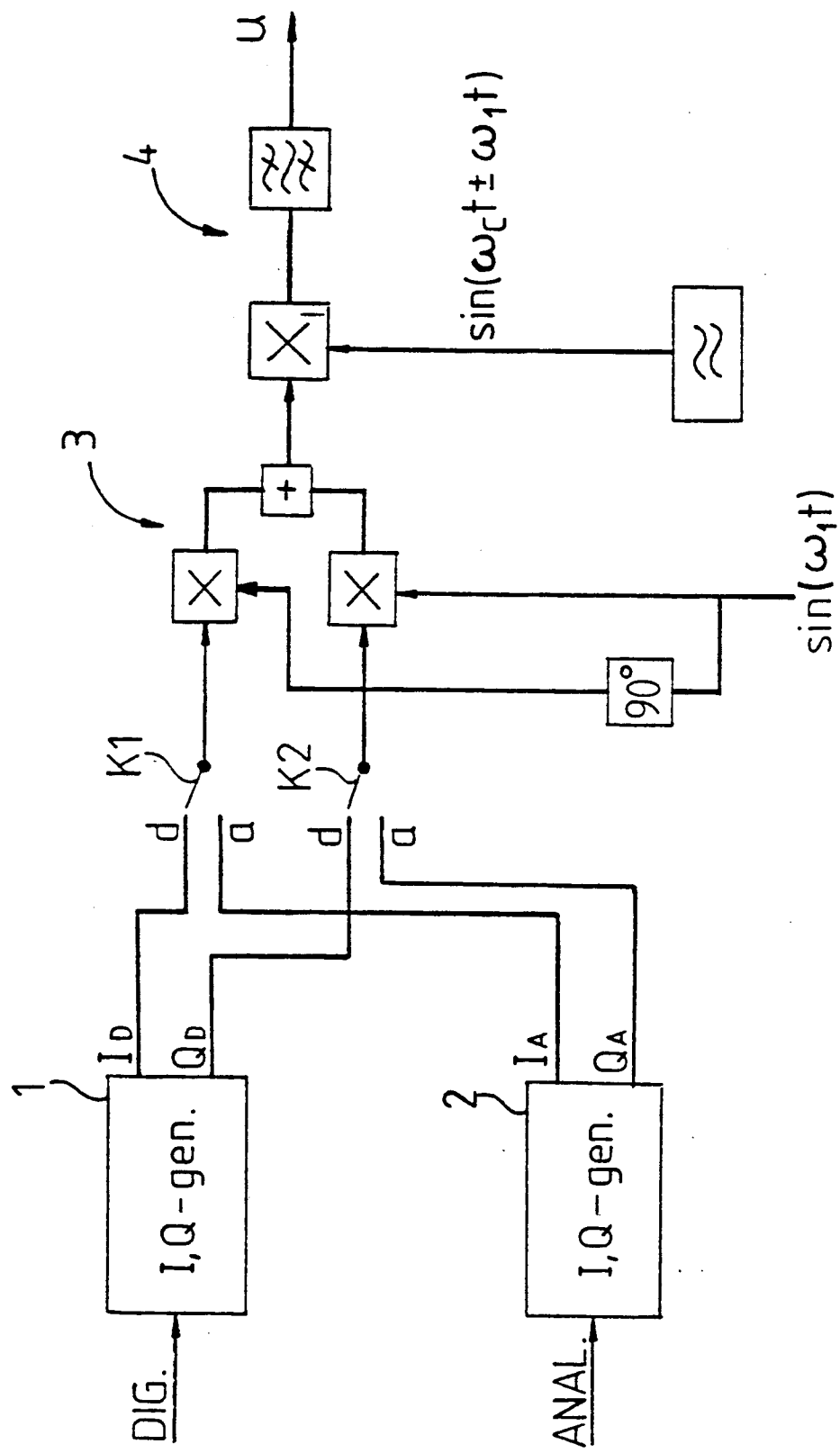

COMBINED ANALOG/DIGITAL FREQUENCY MODULATOR

BACKGROUND OF THE INVENTION

The invention relates to a circuit arrangement in which a radio transmission frequency is modulated by means of a baseband signal.

In order to generate digital modulation (FSK, PSK, QAM, etc.) the so-called I, Q or quadrature principle is typically applied, in which the sin and cos wave shapes of the carrier wave are multiplied by the sin and cos wave shapes of the modulating signal, after which the results are summed.

Analog frequency modulation is typically created by controlling, by means of a voltage corresponding to the modulating signal, a voltage-controlled oscillator generating the carrier wave frequency. Another method of generating analog frequency modulation is based on the I, Q principle, as is the digital modulation. The quadrature I, Q signal shapes are then formed from an analog reception signal. The generation of I, Q signal shapes is known e.g. from the FI patent application 843 826.

In applications using both digital and analog transmission channels (for instance the future US digital mobile phone system) it is advantageous that the same equipment be able to generate both the digital modulation and the analog modulation to be used.

SUMMARY OF THE INVENTION

According to the invention, in order to solve the problem of digital and analog modulation, a circuit has been set up in which a radio frequency signal is modulated by either an analog or digital baseband signal. The digital or analog signal is shaped by an I,Q generator into I,Q wave shapes. These shapes are coupled to the high frequency stage of a transmitter, optionally via an intermediate frequency stage.

BRIEF DESCRIPTION OF THE DRAWING

The sole FIGURE illustrates a circuit for either analog or digital modulation according to the present invention, but with the required amplifiers, filters, etc. not being shown.

DESCRIPTION OF AN ILLUSTRATIVE EMBODIMENT

The illustrated circuit set-up contains the I, Q generators 1 and 2 for analog as well as digital modulation. The desired modulation is selected by means of the couplers (K1, K2).

In the position d of the couplers K1 and K2 digital (DIG) frequency modulation is selected, i.e. signals $I_D$, $Q_D$ are formed where.

$$I_D = \sin \phi(t)$$

$$Q_D = \cos \phi(t)$$

In the formulas, $\phi(t)$ is the signal shape characteristic for each modulation method, corresponding to a reception bit or bit combination.

In the position a of the couplers K1 and K2, analog (ANAL) frequency modulation is selected, i.e. the signals $I_A$, $Q_A$ are formed. In this modulation process the modulating signal is the time derivative $dx/dt$ of the signal $x(t)$:

By means of the I, Q generator 2 the signals $I_A$, $Q_A$ are formed, for which the following equation is valid:

$$I_A = \sin(k \cdot x(t))$$

$$Q_A = \cos(k \cdot x(t))$$

The equipment may include an intermediate frequency $f_1$, with which the selected signals I, Q are first mixed in the intermediate frequency stage 3, as shown in the FIGURE. The I, Q signal can optionally be mixed or heterodyned directly to the final frequency $f_c$. Oscillators for creating the sin and cos signal shapes of these frequency are thus needed. The mixing results of the intermediate frequency stage 3 are summed and the resulting signal is conducted to stage 4 where it is mixed with the transmit frequency $f_c$.

This results in a signal U which is modulated to the transmission frequency according to the formula:

$$U = \sin(\omega_c t + \phi(t)) \text{ with digital modulation}$$

$$U = \sin(\omega_c t + k \cdot x(t)) \text{ with analog modulation}$$

The circuits 1, 2, 3 and 4 are not described in detail in this connection, since they are obvious to a person skilled in the art on the basis of the figure.

I claim:

1. A circuit arrangement for modulating a high frequency signal by a baseband signal that is either an analog signal or a digital signal, comprising:

I,Q generator means for operating on the baseband signal to produce separately (a) digital quadrature wave shapes $I_D$, $Q_D$ in response to a digital baseband signal and (b) analog quadrature wave shapes $I_A$, $Q_A$ in response to an analog baseband signal;

mixer means for mixing the quadrature wave shapes with a high frequency signal; and coupling means for selectively applying one of the digital quadrature wave shapes $I_D$, $Q_D$ and the analog quadrature wave shapes $I_A$, $Q_A$ to said mixer means.

2. A circuit as claimed in claim 1 wherein the mixer means comprises:

an intermediate frequency stage in which the selected I wave shape is mixed with an intermediate frequency signal in a first mixer circuit, the selected Q wave shape is mixed with a quadrature version of the intermediate frequency signal in a second mixer circuit, and the mixed outputs of the first and second mixers are summed to form an intermediate signal; and a high frequency stage in which the summed intermediate signal is mixed with the high frequency signal in a third mixer to form the modulated high frequency signal.

3. A circuit as claimed in claim 1 wherein said I,Q generator means includes a first I,Q generator that produces the digital quadrature wave shape in response to the digital baseband signal and a second I,Q generator that produces the analog quadrature wave shape in response to the analog baseband signal, and wherein said coupling means selectively applies the output of the first I,Q generator and the second I,Q generator to said mixer means.

4. A circuit as claimed in claim 2 wherein the high frequency signal is a radio frequency transmission signal.

* * * * *